United States Patent [19]
Guenther et al.

[11] Patent Number: 5,391,951
[45] Date of Patent: Feb. 21, 1995

[54] INTEGRATED CIRCUIT HAVING AN ADJUSTING COMPONENT AND AN ADJUSTABLE THYRISTOR

[75] Inventors: Uwe Guenther, Nufringen; Ulrich Fleischer, Pliezhausen; Michael Barth, Unterensingen; Jiri Marek; Hans-Juergen Kress, both of Reutlingen; Joerg Behnke, Berlin, all of Germany

[73] Assignee: Robert Bosch GmbH, Stuttgart, Germany

[21] Appl. No.: 25,492

[22] Filed: Mar. 3, 1993

[30] Foreign Application Priority Data

Mar. 7, 1992 [DE] Germany ............................. 4207225

[51] Int. Cl.$^6$ ...................... H01L 21/66; H01L 29/58
[52] U.S. Cl. .................... 327/438; 327/465; 327/565
[58] Field of Search .............. 307/641, 303.1, 638, 307/639, 630, 279, 304

[56] References Cited

U.S. PATENT DOCUMENTS

| 4,399,372 | 8/1983 | Tanimoto et al. | 307/279 |
| 4,404,581 | 9/1993 | Tam et al. | 357/59 |

FOREIGN PATENT DOCUMENTS

| 2705990 | 8/1978 | Germany | H01L 27/04 |
| 3813319 | 11/1989 | Germany | H01L 27/06 |

Primary Examiner—William L. Sikes
Assistant Examiner—Fetsum Abraham
Attorney, Agent, or Firm—Kenyon & Kenyon

[57] ABSTRACT

An integrated circuit having an adjusting component and an adjustable thyristor allows an especially small chip surface to be used. The integrated circuit has a control unit, by means of which the adjusting component is irreversibly switched. The thyristor is designed as a planar component.

17 Claims, 4 Drawing Sheets

INTEGRATED CIRCUIT HAVING AN ADJUSTING COMPONENT AND AN ADJUSTABLE THYRISTOR

FIELD OF THE INVENTION

The present invention relates to integrated circuits and, in particular, to an integrated circuit including a control unit for irreversibly switching an adjusting component.

BACKGROUND OF THE INVENTION

It is known to use arc gaps and Zener diodes as adjusting elements for integrated circuits, in which the adjustment is made on the chip by means of external testing needles. The chip is provided with metallic contact pads to allow a current to be fed to the integrated circuit via the testing needles. Since in each case only one arc gap or Zener diode is adjusted with two contact pads, many pads are needed to adjust a circuit. The surface area utilized for this purpose is then no longer available for supporting electric circuits. Re-adjusting the external testing needles on the pads is problematic, requiring adjusting units of a costly design. Furthermore, German No. DE 27 05 990 describes thyristors, which, as far as their design is concerned, can be used in integrated circuits. However, these thyristors are not designed as irreversible adjusting components.

SUMMARY OF THE INVENTION

The integrated circuit according to the present invention includes an adjusting component having a breaker gap, and a control unit for irreversibly switching the adjusting component from a first state to a second state as a function of a received signal.

The integrated circuit according to the present invention may be adjusted by means of relatively few terminal connections of the circuit, even after packaging of the circuit. Because no contact pads are needed for the testing needles on the integrated circuit, the costly readjustment of the testing needles is no longer necessary, and the space requirements for the circuit are reduced.

In addition, by means of high current loading, the adjusting components may be switched quite easily and irreversibly in a particularly reliable manner. When the adjusting component includes one adjusting element and one breaker gap, the adjusting component can be assembled from simple sub-elements. A predetermined resistance value is adjusted by means of a resistor, which is connected in parallel with the adjusting element. By means of a thyristor or transistor, which is connected in series with the adjusting element, the control unit controls a current flow through the adjusting element. This can be accomplished at an extremely low capacity with one thyristor. By means of a thyristor or transistor, which is arranged in parallel with the adjusting element, the adjusting element is by-passed, in some instances, by signals from the control unit. In this manner, the success of the adjustment can be tested before the irreversible switching operation.

The simplest specific embodiments of such adjusting elements include arc gaps or Zener diodes. To provide several adjusting states, several Zener diodes are each connected in parallel to one thyristor. Thyristors are advantageously used as adjusting components in that they unite the functions of the adjusting element and the breaker gap in one component. Furthermore, it is advantageous that they can be switched in a test operation before the actual, irreversible adjusting operation. If these thyristors are connected in parallel, each in series with one diode and one arc gap, various adjusting states can be provided. Such thyristors are designed quite simply as integrated components. The further addition of a lamellar implantation or diffusion emanating from the anode prevents the thyristors from switching in the case of steep voltage edges. Such thyristors can be produced on both p-silicon and n-silicon substrates. Because only one anode and only one cathode are present, the current required to short the thyristors is reduced. This effect can be further intensified when the anode and cathode exhibit a peak on the mutually-opposing side.

DETAILED DESCRIPTION

Figure 1:
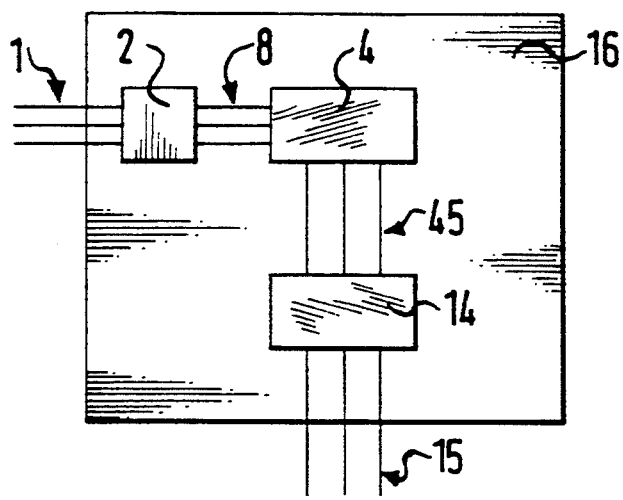
FIG. 1 shows a block diagram of an integrated circuit according to the present invention.

Referring to FIG. 1, an integrated circuit 16 includes a circuit element 14 to be adjusted, as well as, adjusting components 4 and a control unit 2. The control unit 2 has inputs 1 and adjusting lines 8. The circuit element 14 to be adjusted has adjusting lines 45 and output lines 15. The function of the circuit element 14 to be adjusted is not critical to the principles underlying the present invention. It is intended in particular for use on evaluation circuits for sensors, since these circuits must often be adjusted in costly operations, due to manufacturing-dependent tolerances of the sensors. The sensors are integrated here in the circuit element 14 to be adjusted. For the adjusting operation, the sensor is stimulated in a controlled manner. The signal that is formed thereby is compared to a threshold value and corrected by adjusting the circuit. The data from the sensors, which initially have not been adjusted, can be read, for example, via the outputs 15. The adjustment then takes place on the basis of signals which are fed to the inputs 1. It is also possible for the sensor data to be routed directly to the control unit 2 for processing. In such a case, the inputs 1 would be restricted to triggering the adjustment operation.

In accordance with the present invention, the control unit 2 is integrated together with the adjusting components 4 and the circuit element 14 to be adjusted, including both a monolithic integration on one chip and a hybrid integration. The number of adjusting lines 8 may exceed the number of inputs 1. Since the adjusting lines 8 are much smaller, as a result of integration, than the input lines 1 leading to the outside or than the contact pads for external testing needles, a large number of adjusting components 4 can be adjusted in a small amount of space. Connecting the control unit 2 between the input lines 1 and the adjusting components 4 reduces the amount of space required for the circuit elements 14 being adjusted. However, this advantage is able to be realized only when the space requirement for the control unit 2 is less than the space requirement for an adjustment performed via external supply lines. This is particularly the case when the control unit 2 can switch at small capacities to make the adjustment, and can thus be constructed very small.

The adjusting components according to the present invention thus exhibit two characteristics, i.e., they can be varied irreversibly, and this variation can be triggered by low-capacity control signals. These functions of the adjusting component 4 are performed in the exemplary circuits shown in FIGS. 2 and 3 by two components, i.e., one adjusting element 5 or 6, and one breaker gap 11. Arc gaps 5 or Zener diodes 6 are used as adjusting elements; thyristors 11 or transistors are used as breaker gaps. When thyristors 44 are used as adjusting components 4, both functions, the breaker gap and adjusting. element, are united in one component. The thyristor according to the present invention shown in FIGS. 4–8 is capable of being both irreversibly varied and triggered at a low capacity.

Figure 2A:
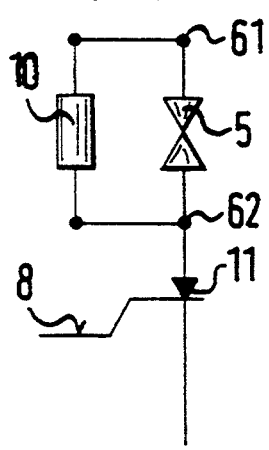
FIGS. 2a and 2b show configurations of the components for adjusting the circuit of FIG. 1.
Figure 2B:
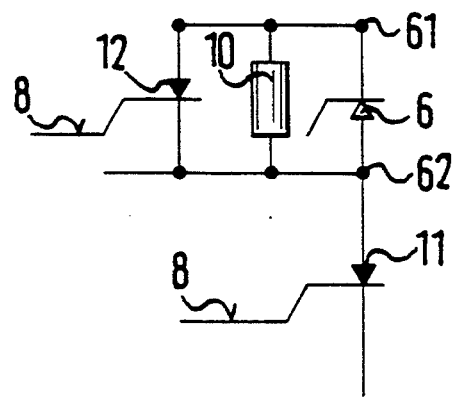

In FIG. 2a, reference numeral 5 denotes an arc gap. In FIG. 2b, reference numeral 6 denotes a Zener diode. A thyristor 11, which is connected via the adjusting line 8 to the control unit 2, is connected in series with the arc gap 5 or the Zener diode 6. A resistor 10 is connected in parallel with the arc gap 5 or the Zener diode 6. A thyristor 12, which is likewise connected to the control unit 2, is connected in parallel with the Zener diode 6. The thyristors 11 and 12 can be replaced by transistors. By firing the thyristors 11, a current can be fed through the arc gap 5 or the Zener diode 6. If the current which flows thereby exceeds a specified value, the arc gap 5 is fused, or the Zener diode 6 becomes irreversibly conductive (shorted) as a result of a metallically conductive path between the terminal connections. By means of the parallel-connected resistor 10, a specific resistance value can be attained between the nodal points 61 and 62. In the case of the arc gap 5, the resistor 10 is activated after the arc gap 5 is fused. In the case of the Zener diode 6, the resistor 10 is activated between the terminal connections 61 and 62 before the Zener diode 6 is shorted. By means of the parallel-connected thyristor 12, the Zener diode 6 can be by-passed in the non-conductive state. In this manner, the adjustment of the circuit can be reversibly tested.

Figure 3:
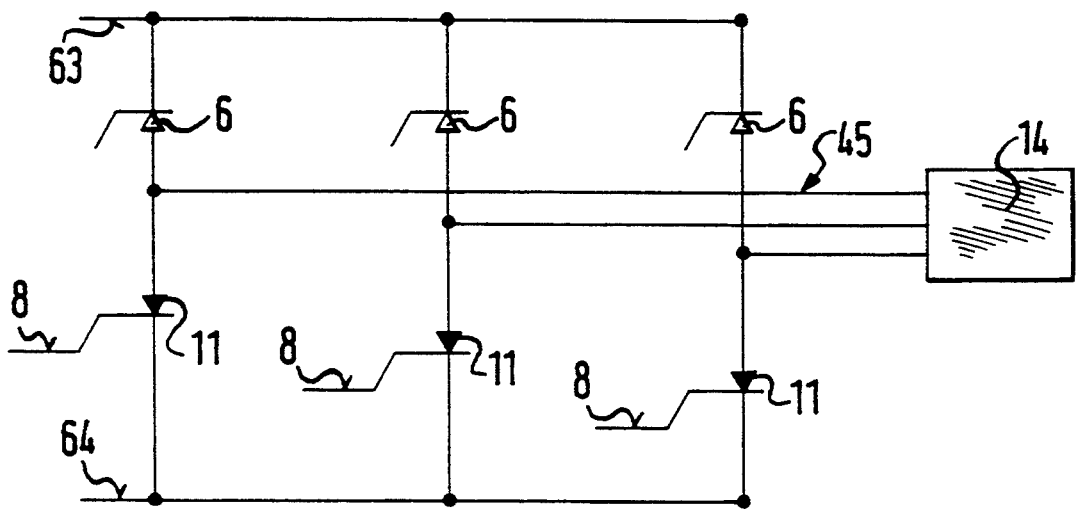
FIG. 3 shows the parallel connection of Zener diodes as adjusting components.

In FIG. 3, each of parallel-connected Zener diodes 6 has a respective series-connected thyristor 11. The circuit element 14 to be adjusted is provided via adjusting lines 45 with terminal connections between the Zener diodes 6 and the thyristors 11. The thyristors 11 are triggered via the adjusting lines 8 by the control unit 2. With this arrangement, various adjusting values can be provided for the circuit element 14 to be adjusted. To make the adjustment, a potential difference is applied between line 63 and line 64. By selectively triggering individual thyristors 11, the corresponding Zener diodes 6 can be irreversibly altered to be metallically conductive. After the adjusting operation, the potential of line 63 is fed to an arbitrary point of the circuit element 14. For example, the circuit element 14 can have a resistance cascade, whose end point is at the same potential as line 63.

Figure 4:
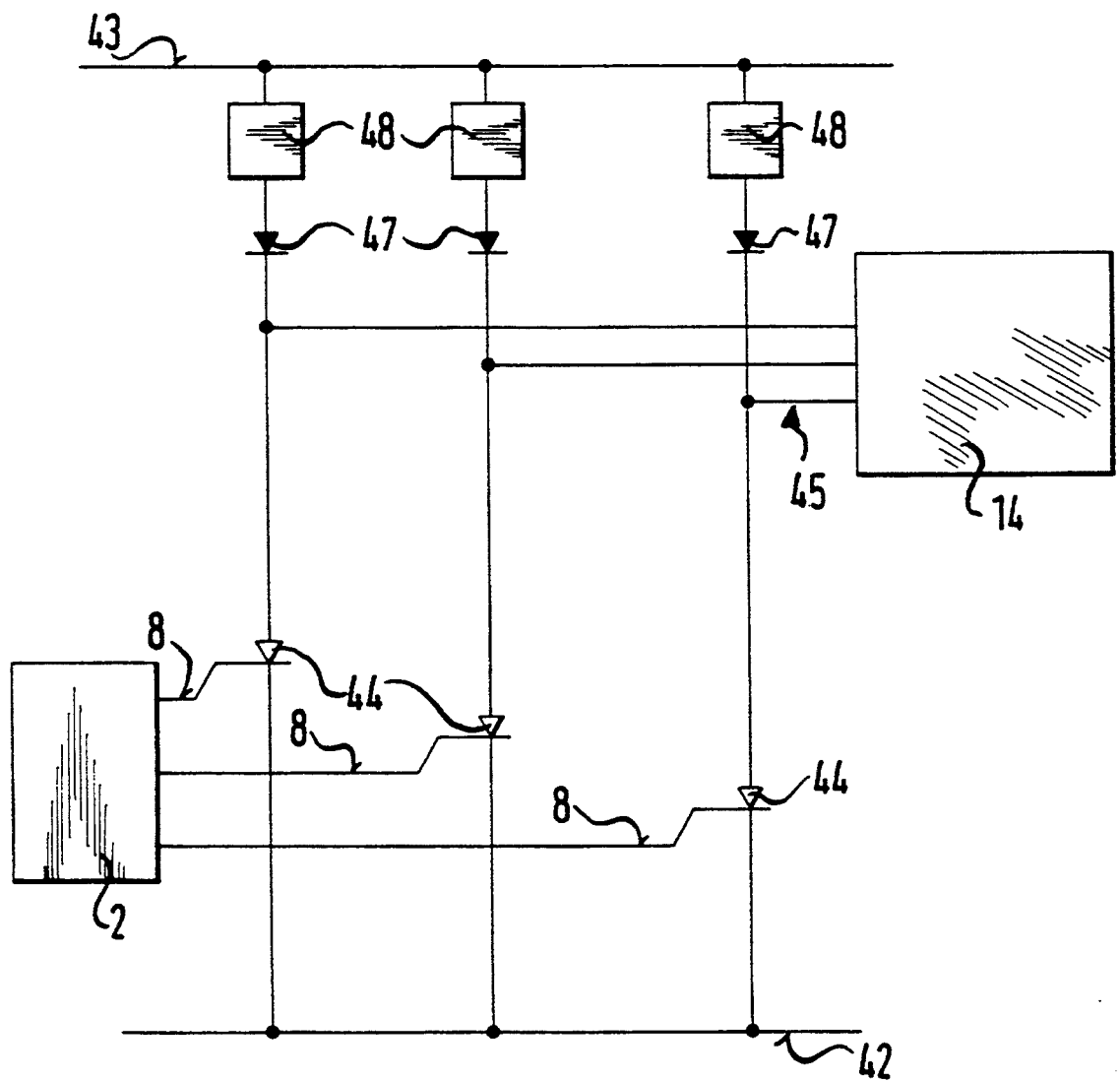
FIG. 4 shows the parallel connection of thyristors as adjusting components.

In FIG. 4, each of the parallel-connected thyristors 44 is connected in series with an arrangement of an arc gap 48 and a diode 47. The circuit element 14 to be adjusted is connected via the adjusting lines 45 between the thyristors 44, on the one side, and the diode 47 and the arc gap 48, on the other side. The thyristors 44 can be fired via the lines 8 by the control unit 2. When a specified current flows through the thyristors 44, the thyristors 44 are irreversibly altered to be metallically conductive. The adjustment of the circuit element 14 can be tested before the thyristors 44 become shorted by firing the thyristors under a restricted load current. The arc gaps 48 can be irreversibly fused at another specified load current. The load current at which the arc gaps 48 are fused is greater than the line load required to short the thyristors 44. The diodes 47 can be connected in a different manner, as long as it is guaranteed that two oppositely disposed diodes are situated between two terminal connections of lines 45.

Figure 8:
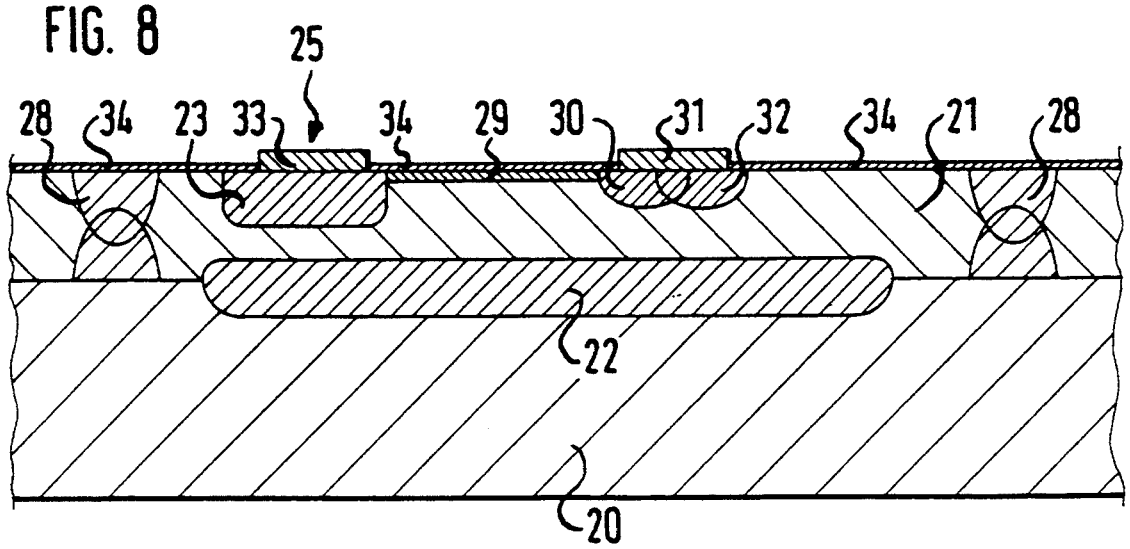
FIG. 8 shows the protective resistor in another cross-sectional view of the thyristor shown in FIG. 5.

The circuit element 14 can be adjusted as follows. By switching through the thyristors 44 in a test operation, the optimal adjustment of the circuit element 14 is determined at a first small potential difference between lines 42 and 43. The adjusting lines 45 can be connected individually to the discrete potential of line 42, because they can be insulated from one another by the diodes 47. By applying a second, higher potential difference between lines 42 and 43 and by triggering an individual thyristor 44 through the control unit 2, a current flows through the triggered thyristor 44. This current suffices to short the thyristor 44. By applying a third, still greater potential difference between lines 42 and 43, a current will then flow, which fuses the arc gap 48 corresponding to the shorted thyristor 44. The thyristors 44 are designed to tolerate a sudden voltage rise, for example, when the fusing voltage is applied to the thyristors, without their being switched through by this steep voltage edge. The structure of an individual thyristor 44 is shown in FIG. 8. The circuit is adjusted further by successively causing the previously selected thyristors 44 to become shorted and by fusing the arc gaps 48 allocated to them.

Figure 5:
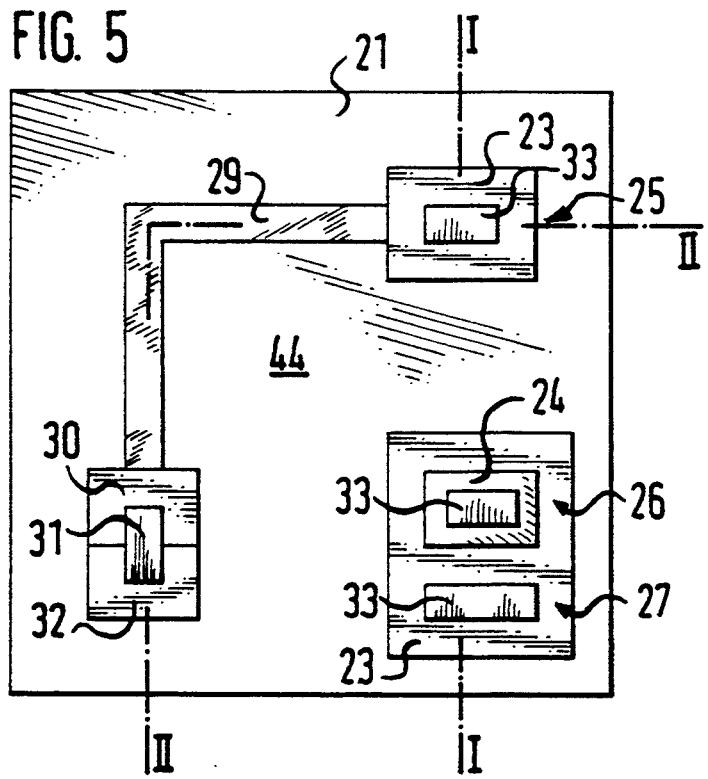
FIG. 5 shows a schematic view of the thyristor according to the present invention.

In a greatly enlarged top view, FIG. 5 schematically depicts a planar thyristor, which can be inserted as a thyristor 44 in the circuit shown in FIG. 4. The thyristor of FIG. 5 is originally manufactured on a p-silicon substrate. As such, the doping is interchanged , i.e., n becomes p and p becomes n, the polarity of the voltages is reversed, i.e., the anode becomes a cathode and the cathode becomes an anode, and the operational sign of the gate voltage is changed. However, equivalent thyristors can also be produced on n-silicon substrates.

In an N-layer 21, an embedded P-region 23, together with a metallic coating 33, constitutes the anode 25 of the thyristor 44. The cathode 26 and the gate 27 exhibit a shared P-region 23, which is embedded in the N-layer 21. Under the metallic coating 33 of the cathode 26, another N-region 24 is embedded in the P-region 23 of the cathode 26 and the gate 27. The exact refinement of this thyristor is shown in FIG. 7, which shows a cross-sectional view along line I—I of FIG. 5.

A lamellar, weakly doped P-region 29 extends from the P-region 23 of the anode 25. Situated at the end of the lamellar P-region 29 is a P+-region 30, a metallic coating 31, and an N+-region 32. It is important to note that this end of the lamellar region 29 is embedded in the N-layer 21. The exact refinement is shown in a cross-sectional view along line II—II in FIG. 8.

Figure 6:
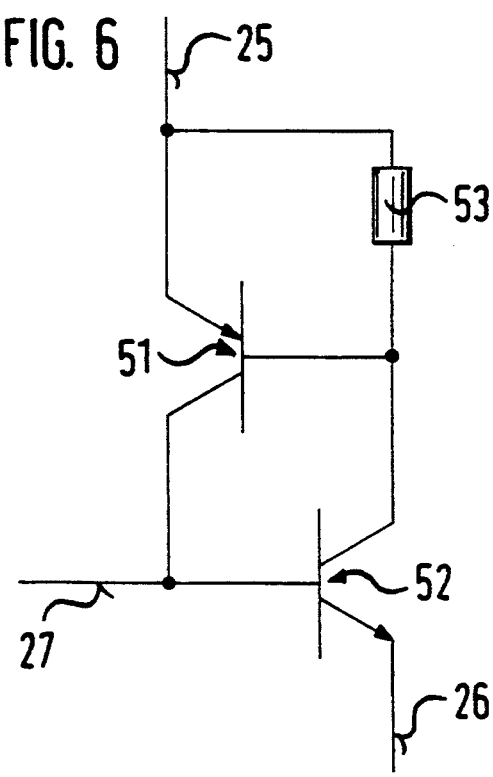
FIG. 6 shows an equivalent circuit diagram of the thyristor shown in FIG. 5.

In FIG. 6, the equivalent circuit diagram of the thyristor 44 depicted in FIG. 5 is shown. Reference numeral 25 denotes the anode; 26 the cathode; and 27 the gate. The thyristor can be depicted alternatively by the interconnection shown in FIG. 6 of a PNP-transistor 51 and an NPN-transistor 52. Together with the additional regions (30,31,32) at the end, the lamellar region 29 forms the protective resistor 53 shown here. The function of this resistor is described below with reference to FIG. 8.

Figure 7:
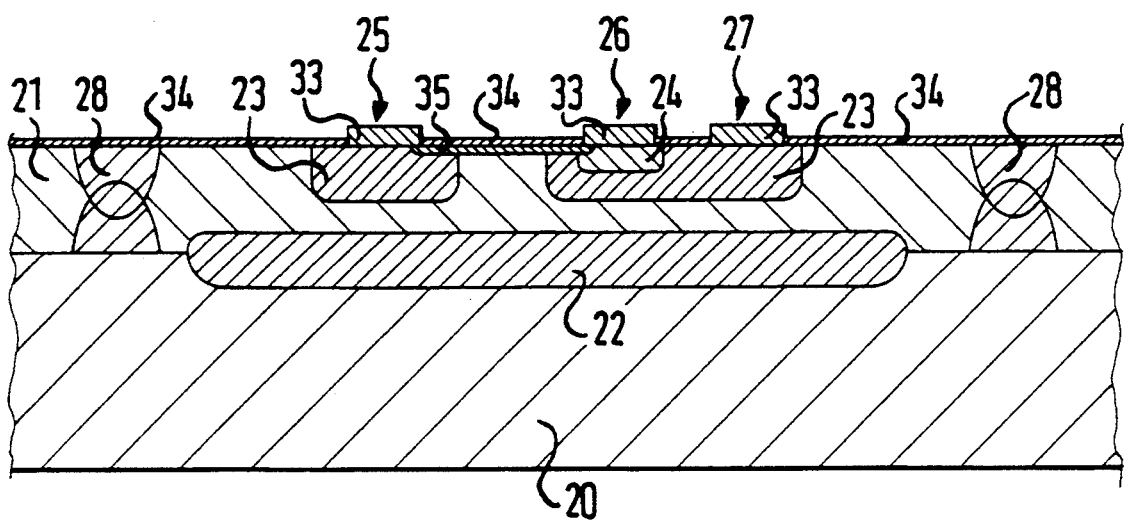
FIG. 7 shows a cross-sectional view of the thyristor shown in FIG. 5.

FIG. 7 illustrates a cross-sectional view through a planar thyristor along line I—I of FIG. 5. This planar thyristor can be inserted as a thyristor 44 in the circuit shown in FIG. 4. Reference numeral 20 denotes a P-substrate; 21 an N-layer deposited on this P-substrate; and 22 an N+-buried region situated inbetween. The anode 25 has a metallic coating 33 and a P-region 23. The cathode 26 and the gate 27 have a shared P-region 23 and, in each case, a metallic coating 33. In addition, the cathode 26 also has an N-region 24. The surface of the thyristor is covered with a passivation layer 34 of silicon oxide and/or silicon nitride. The component is insulated from adjacent components by a deep-extending P-region 28. In contrast to conventional planar thyristors, this planar thyristor has only one anode region and only one cathode region. As a result, the current density between the anode 25 and the cathode 26 is particularly great. Given a high current load, a metallic filament 35 forms, therefore, between the anode 25 and the cathode 26. This metallic filament 35 effects the irreversible short circuit between the anode 25 and the cathode 26.

In FIG. 8, the protective resistor 53 for the thyristor is shown in a cross-sectional view along line II—II. Reference numeral 20 denotes a P-substrate; 21 an N-layer deposited on this P-substrate; and 22 an N+-buried region situated in-between. A lamellar P-region 29 is connected to the P-region 23 of the anode 25. The depth and the doping of the P-region 29 are negligible compared to that of the P-region 23 of the anode 25. A P+-region 30 is situated at the end of the lamellar P-region 29. This P+-region 30 makes electrical contact with a metallic coating 31 which, in turn, makes electrical contact with an N+-region 32. This N+-region 32 is embedded in the N-layer 21. As a result of the negligible doping and slight depth, the lamellar P-region 29 has a relatively-highly-defined resistance value. An ohmic contact with the N-layer is established via the P+-region 30, the metallic contact 31, and the N+-region 32. This arrangement thus constitutes an ohmic resistor between the first P-zone 23 and the first N-zone 21 of the PNPN-thyristor, as described above with reference to FIG. 6. This resistor, which is situated parallel to the first PN-junction of the thyristor, prevents the thyristor from being switched in case of a sudden voltage rise across the anode. This ensures that the thyristor does not fire by itself when voltages are applied to the thyristor.

What is claimed is:

1. An integrated circuit comprising:
   an adjusting component including a breaker gap and at least one adjusting element, the breaker gap arranged in series with the at least one adjusting element, the breaker gap including a thyristor; and
   a control unit coupled to the adjusting component for receiving an input signal and for irreversibly switching the adjusting component between a conducting state and an insulating state by switching the breaker gap as a function of the input signal.

2. The integrated circuit according to claim 1, wherein the adjusting component further includes a resistor coupled in parallel with the adjusting element.

3. The integrated circuit according to claim 1, wherein the adjusting component further includes another thyristor coupled in parallel with the adjusting element.

4. The integrated circuit according to claim 1, wherein the adjusting element includes an arc gap.

5. The integrated circuit according to claim 1, wherein the adjusting element includes a Zener diode.

6. The integrated circuit according to claim 1, wherein the adjusting component further includes:
   a plurality of Zener diodes coupled in parallel, a first terminal of each of the Zener diodes being coupled to a first line potential;
   a plurality of thyristors being controlled by the control unit, a first terminal of each of the thyristors being coupled to a second terminal of a respective Zener diode, a second terminal of each of the thyristors being coupled to a second line potential; and
   a circuit element to be adjusted coupled to the first terminal of each of the plurality of thyristors.

7. The integrated circuit according to claim 1, wherein the adjusting component further includes:
   a plurality of arc gaps coupled in parallel, a first terminal of each of the arc gaps being coupled to a first line potential, the arc gaps fusing upon receiving a preselected load current;
   a plurality of diodes, a first terminal of each of the diodes being coupled to a second terminal of a respective arc gap; and
   a plurality of thyristors being controlled by the control unit, a first terminal of each of the thyristors being coupled to a second terminal of a respective diode, a second terminal of each of the thyristors being coupled to a second line potential.

8. The integrated circuit according to claim 7, further comprising a circuit element to be adjusted coupled to the first terminal of each of the thyristors.

9. An integrated circuit comprising:
   an adjusting component including a breaker gap and at least one adjusting element, the breaker gap including a thyristor, the thyristor becoming conductive upon application of a predetermined current loading; and
   a control unit coupled to the adjusting component for receiving an input signal and for irreversibly switching the adjusting component from an insulating state to a conducting state by switching the breaker gap as a function of the input signal.

10. The integrated circuit according to claim 9, wherein the at least one adjusting element includes a plurality of thyristors coupled in parallel, a first terminal of each of the plurality of thyristors coupled to a first line potential, the adjusting component further including:
   a plurality of arc gaps, the plurality of arc gaps being fused at a specified current load, the specified current load being greater than the predetermined current loading;
   a plurality of diodes, each of the plurality of diodes having a first end coupled to a respective one of the plurality of arc gaps and a second end coupled to a second terminal of a respective one of the plurality of thyristors; and a circuit element to be adjusted coupled to the second terminal of each of the thyristors via a plurality of adjusting inputs.

11. The integrated circuit according to claim 9, wherein the thyristor includes:
   three terminal connections having conductive contacts;
   a substrate of a first conduction type;
   a first layer of a second conduction type in contact with the substrate;
   a first region of the first conduction type in contact with the first layer and the three terminal connections;
   a second region of the second conduction type in contact with the first region and at least one of the three terminal connections;
   an insulating region of the first conduction type extending through the first layer;
   a second layer of the second conduction type disposed between at least a portion of the substrate and the first layer; and
   an insulating layer in contact with the substrate.

12. The integrated circuit according to claim 11, wherein the substrate and the first layer are composed of silicon, and the insulating layer is composed of a silicon compound selected from the group consisting of silicon oxide and silicon nitride.

13. The integrated circuit according to claim 11, wherein the thyristor further includes:
   a lamellar region in contact with a portion of the first region;
   a third region of the first conduction type in contact with the lamellar region;
   a fourth region of the second conduction type embedded in the first layer; and
   a conductive contact coupling the third and fourth regions.

14. The integrated circuit according to claim 11, wherein the first conduction type is p-type, the second conduction type is n-type, and the three terminal connections are an anode, a cathode, and a gate.

15. The integrated circuit according to claim 11, wherein the first conduction type is n-type, the second conduction type is p-type, and the three terminal connections are an anode, a cathode, and a gate.

16. The integrated circuit according to claim 11, wherein the first region has a rectangular cross-section.

17. The integrated circuit according to claim 11, wherein the thyristor further includes a plurality of first regions, each of the first regions having a peak portion.

* * * * *